(12) United States Patent
Goeser et al.

(10) Patent No.: US 6,531,908 B1
(45) Date of Patent: Mar. 11, 2003

(54) POWER OUTPUT STAGE FOR SWITCHING INDUCTIVE LOADS WITH REDUCED RADIATION EMISSION

(75) Inventors: Gerhard Goeser, Pentling (DE); Mark Elliott, Regensburg (DE); Donald Preslar, Ringoes, NJ (US)

(73) Assignee: Siemens Aktiengesellschaft, Munich (DE)

( * ) Notice: Subject to any disclaimer, the term of this patent is extended or adjusted under 35 U.S.C. 154(b) by 726 days.

(21) Appl. No.: 08/940,467

(22) Filed: Sep. 30, 1997

(30) Foreign Application Priority Data

Sep. 30, 1996 (DE) .......................... 196 40 433

(51) Int. Cl.$^7$ .................................. H03K 5/08
(52) U.S. Cl. ..................... 327/309; 327/318; 327/320
(58) Field of Search .............................. 327/309, 311, 327/312, 314, 318, 320, 323, 325, 326, 329; 361/56

(56) References Cited

U.S. PATENT DOCUMENTS

| | | | |
|---|---|---|---|
| 5,079,455 A | * | 1/1992 | McCafferty et al. ........ 327/318 |
| 5,434,527 A | * | 7/1995 | Antone ........................ 327/391 |
| 5,532,635 A | * | 7/1996 | Watrous et al. ............. 327/310 |
| 5,559,658 A | * | 9/1996 | Cooper et al. ................. 361/56 |
| 5,629,586 A | * | 5/1997 | Yasuda et al. ................. 315/46 |
| 5,642,251 A | * | 6/1997 | Lebbolo et al. ............... 361/84 |
| 5,725,359 A | * | 3/1998 | Dongo et al. .............. 417/44.9 |
| 5,781,396 A | * | 7/1998 | Fritschi et al. .............. 361/143 |

FOREIGN PATENT DOCUMENTS

| | | |
|---|---|---|
| EP | 0167734 A1 | 1/1986 |
| EP | 0680147 A2 | 11/1995 |
| GB | 2056808 A | 3/1981 |

* cited by examiner

*Primary Examiner*—Kenneth B. Wells
(74) *Attorney, Agent, or Firm*—Laurence A. Greenberg; Werner H. Stemer; Gregory L. Mayback

(57) ABSTRACT

A power output stage for switching inductive loads contains a series circuit having a load and a switching transistor. A series connected circuit formed of a blocking diode and a multiplicity of Zener diodes is disposed between the drain and gate electrodes of the switching transistor. A capacitor, a resistor or a series or parallel circuit of a capacitor and a resistor is disposed in parallel with at least one of the Zener diodes. The circuit configuration rounds off the pronounced kink in the drain voltage when the Zener protection cuts in during a switched state of the switching transistor.

4 Claims, 1 Drawing Sheet

POWER OUTPUT STAGE FOR SWITCHING INDUCTIVE LOADS WITH REDUCED RADIATION EMISSION

BACKGROUND OF THE INVENTION

Field of the Invention

The invention relates to a power output stage for switching inductive loads, for example, inductive loads such as fuel-injection valves for internal-combustion engines.

When inductive loads are switched, in particular switched off, a transition to a high voltage state is executed in a very short time. Published European Patent Application 0 680 147 A2 describes a power output stage, in which that high switch-off voltage is limited by Zener diodes in order to protect the switching transistor. When the Zener protection cuts in, a pronounced kink is produced in the time profile of the voltage. That may result in an excessive emission of electromagnetic radiation that can have a detrimental effect on the environment. That is to say other electrical or electronic systems, in automobiles, for example, a car radio may be detrimentally affected by the electromagnetic radiation emission.

In order to reduce the interference from radiation emissions, in the case of switched power output stages with or without Zener protection, it is widely known to retard the time profile of the high voltage transition during the switching-off period. However, that solution retards the entire switching process and results in the switching transistor being exposed to increased power losses and impairment of the switching speed.

SUMMARY OF THE INVENTION

It is accordingly an object of the invention to provide a power output stage for switching inductive loads, which overcomes the herein-mentioned disadvantages of the heretofore-known devices and methods of this general type, and which develops a switched power output stage for inductive loads to the extent that interference produced by radiation emissions during switching of loads is substantially reduced without retarding the switching process and without increasing the power loss in the switching transistor.

With the foregoing and other objects in view there is provided, in accordance with the invention, a power output stage for switching inductive loads, comprises a switching transistor having a drain, a gate and a source; a load having a first end and a second end connected in series with the drain of the switching transistor; a voltage source having a first pole and a second pole, the first end of the load connected to the first pole and the source of the switching transistor connected to the second pole; a series connected circuit having a blocking diode and at least one Zener diode connected between the second end of the load and the gate of the switching transistor; and a capacitor connected in parallel with at least one of the at least one Zener diodes.

In accordance with alternate embodiments of the invention, instead of having a capacitor connected in parallel with at least one of the least one of the Zener diodes there can be either a. a resistor, b. a series connected circuit of a capacitor and resistor, or c. a parallel connected circuit of a capacitor and resistor, in parallel with at least one of the least one of the Zener diodes.

Other features which are considered as characteristic for the invention are set forth in the appended claims.

Although the invention is illustrated and described herein as embodied in a power output stage for switching inductive loads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
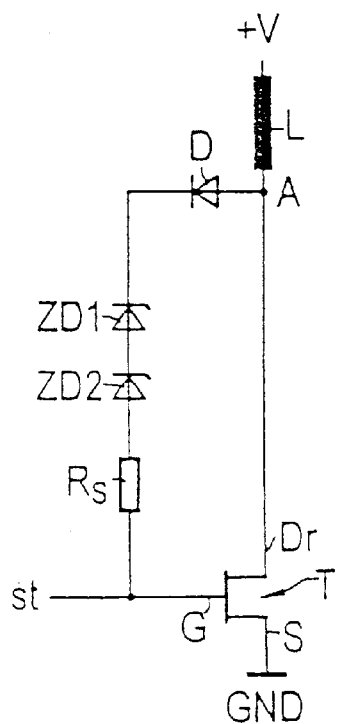
FIG. 1 is a circuit diagram of a prior art power output stage.

Referring now to the figures of the drawing in detail and first, particularly to FIG. 1 thereof, there is shown a prior art circuit of a power output stage for driving an inductive load L, such as a fuel-injection valve of an internal-combustion engine (not illustrated).

An excitation coil L of the fuel-injection valve is in series with a low-side n-channel power MOS transistor (switching transistor) T, between the plus pole and the minus pole GND of an operating-voltage source +V.

Connected between the excitation coil L and the control electrode (gate electrode G) of the switching transistor T, is a blocking diode D. The blocking diode D is forward-biased in the direction of the control electrode G. Two Zener diodes ZD1 and ZD2, forward-biased in the opposite direction, and a resistor Rs in series configuration are connected in series between the blocking diode D and the gate electrode G.

Since it is not possible to obtain Zener diodes for arbitrarily high Zener voltages, it is known to use a series configuration of a plurality of Zener diodes in which the Zener voltages are additive.

Figure 3:
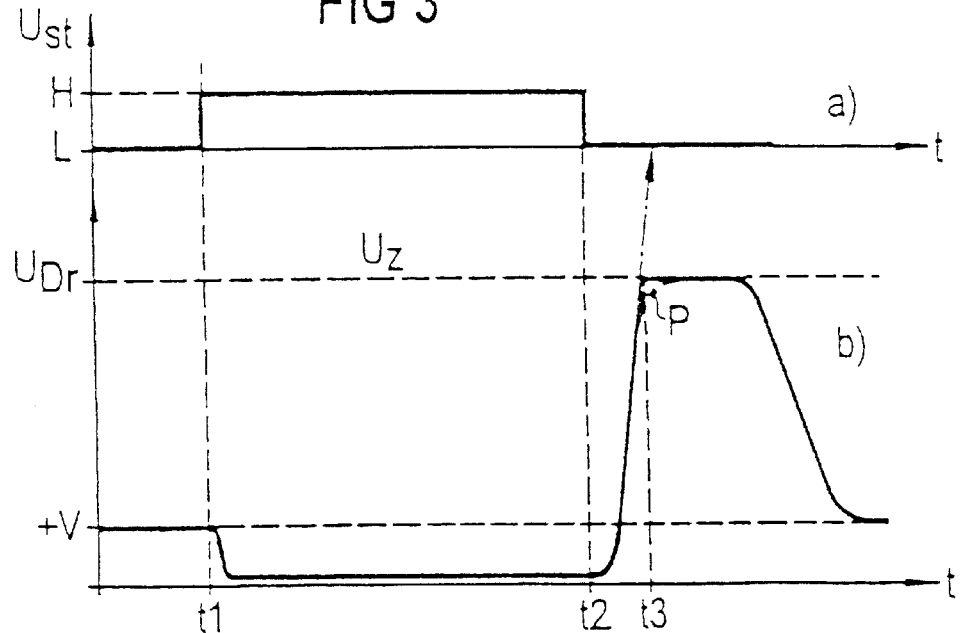
FIG. 3 is a diagram showing voltage states of $U_{st}$ and $U_{Dr}$.

In FIG. 3, the upper signal diagram a) shows the time profile of a control signal $U_{st}$ which is fed to the gate electrode G of the switching transistor T. The lower signal diagram b) shows the time profile of the drain voltage $U_{Dr}$ (the voltage at the connection point A) of the power output stage during a switching process.

When the load L is switched off ($U_{st}$=L), the two terminals of the load and also the drain electrode Dr of the switching transistor T are at the potential of the plus pole +V, for example +12V. When a control signal arises ($U_{st}$=H) at time t1, the switching transistor T is turned on (conducting), the voltage at the drain electrode Dr becomes approximately 0V, and a current flows from the plus pole +V through the load L and the switching transistor T to the minus pole GND. FIG. 3 shows that the load is switched on so long as the control signal $U_{st}$ is present (high).

When the load L is switched off at time t2, the switching transistor T becomes non-conducting ($U_{st}$=L). The drain voltage $U_{Dr}$ at point A increases rapidly as a result of the inductance of the load L (as shown by the dot dash line in FIG. 3), and could assume values which might damage the switching transistor T. However, this is prevented by a series circuit formed of a blocking diode D, two Zener diodes ZD1 and ZD2 and a resistor Rs between the connection point A and the control electrode G of the switching transistor T.

When the switching transistor T is on (conducting), the blocking diode D prevents current flow from the gate electrode G to the drain electrode Dr. The two Zener diodes ZD1 and ZD2 which are connected in series each have a Zener voltage $U_Z$ of for example 40V. Therefore, break down occurs at a Zener voltage of $U_Z$=80V. When the drain voltage $U_{Dr}$ reaches a value of about 80V, a current flows from point A to the gate electrode G. The current flow turns on the switching transistor T at time t3 and thereby limits the drain voltage $U_{Dr}$ to the value of the Zener voltage $U_Z$. The coil energy of the load is thereby rapidly depleted. As soon as the coil current is lowered, the drain voltage $U_{Dr}$ decreases below the Zener voltage $U_Z$ and the switching transistor T becomes non-conducting again (the Zener diodes block once more), so that the drain voltage rapidly drops to the potential +V.

Due to the switching characteristics of the switching transistor T, the increase in the drain voltage $U_{Dr}$ at time t2 when the load L is switched off takes place steadily. On the other hand, the cut-in of the Zener protection (the limitation of the drain voltage to the Zener voltage) at time t3 takes place with a pronounced kink, which releases a significant amount of electromagnetic radiation interference.

Figure 2:
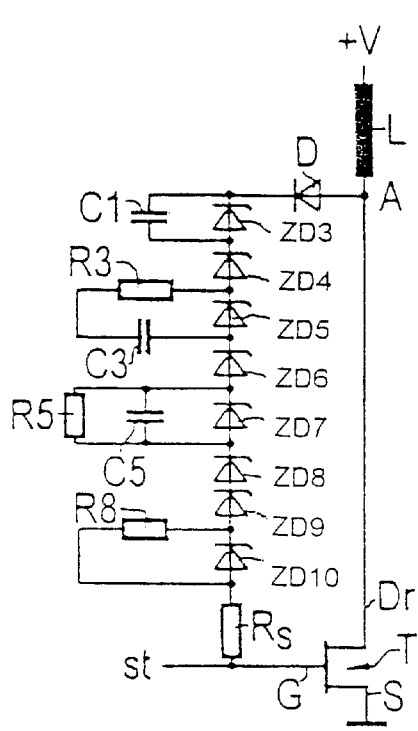
FIG. 2 is a circuit diagram of a power output stage according to the invention.

FIG. 2 shows a circuit according to the invention of the instant application which makes it possible to minimize the interference caused by the radiation emissions. The circuit corresponds essentially to the circuit according to FIG. 1, the same circuit elements being given the same reference numbers, so that it is not necessary to give another description.

The difference between the circuit of the instant application shown in FIG. 2 and the prior art circuit according to FIG. 1, resides in a multiplicity of Zener diodes connected in series instead of just two Zener diodes. For example, eight Zener diodes ZD3 to ZD10 each having a Zener voltage of 10V are provided for a Zener voltage of 80V.

In the illustrative embodiment according to FIG. 2, in order to demonstrate a number of possibilities, Zener diode ZD3 has a capacitor C1 connected in parallel with it, Zener diode ZD5 has a parallel circuit of a capacitor C3 and a resistor R3 connected in parallel with it, Zener diode ZD7 has a series circuit of a capacitor C5 and a resistor R5 connected in parallel with it, and Zener diode ZD10 has a resistor R8 connected in parallel with it.

The effect of connecting a capacitor, a resistor or a series or parallel circuit of a capacitor and a resistor, in parallel with a Zener diode, is to slightly time-delay the voltage which builds up across the Zener diode, depending on the rating of the components. Therefore, the cut-in of the limitation of the drain voltage $U_{Dr}$ to the Zener voltage $U_Z$ takes place not with a pronounced kink, but, depending on the number of Zener diodes "delayed" in this way, with a polygonal shape P, and thus more rounded, as represented by dashes in FIG. 3 at time t3. As a result, substantially less electromagnetic radiation interference is released than with the circuit according to FIG. 1. The rest of the profile of the drain voltage $U_{Dr}$ corresponds to the profile already represented in FIG. 3.

The circuits according to FIGS. 1 and 2 are equipped with n-channel field-effect transistors T. They function equally well with p-channel FETs or with other transistors (pnp instead of npn transistors) with reversal known per se of the voltage or interchange of the emitter and collector electrodes.

We claim:

1. A power output stage for switching inductive loads, comprising:
   a switching transistor having a drain, a gate and a source;
   a load having a first end and a second end connected in series with said drain of said switching transistor;
   a voltage source having a first pole and a second pole, the first end of the load connected to said first pole and said source of said switching transistor connected to said second pole;
   a series connected circuit having a blocking diode and at least one Zener diode connected between the second end of the load and said gate of said switching transistor; and
   a capacitor connected in parallel with said at least one Zener diode.

2. A power output stage for switching inductive loads, comprising:
   a switching transistor having a drain, a gate and a source;
   a load having a first end and a second end connected in series with said drain of said switching transistor;
   a voltage source having a first pole and a second pole, the first end of the load connected to said first pole and said source of said switching transistor connected to said second pole;
   a series connected circuit having a blocking diode and at least one Zener diode connected between the second end of the load and said gate of said switching transistor; and
   a resistor connected in parallel with said at least one Zener diode.

3. A power output stage for switching inductive loads, comprising:
   a switching transistor having a drain, a gate and a source;
   a load having a first end and a second end connected in series with said drain of said switching transistor;
   a voltage source having a first pole and a second pole, the first end of the load connected to said first pole and said source of said switching transistor connected to said second pole;
   a series connected circuit having a blocking diode and at least one Zener diode connected between the second end of the load and said gate of said switching transistor; and
   a series connected circuit having a capacitor and a resistor connected in parallel with said at least one Zener diode.

4. A power output stage for switching inductive loads, comprising:
   a switching transistor having a drain, a gate and a source;
   a load having a first end and a second end connected in series with said drain of said switching transistor;
   a voltage source having a first pole and a second pole, the first end of the load connected to said first pole and said source of said switching transistor connected to said second pole;
   a series connected circuit having a blocking diode and at least one Zener diode connected between the second end of the load and said gate of said switching transistor; and
   a parallel connected circuit having a capacitor and a resistor connected in parallel with said at least one Zener diode.

* * * * *